United States Patent [19]
Huang et al.

[11] Patent Number: 5,905,751
[45] Date of Patent: May 18, 1999

[54] LASER MODULES AND METHODS OF MANUFACTURING SAME

[75] Inventors: Chao-Chi Huang; Tony K. T. Chen; Der-Shyang Jan; Ming-Chung Chiu; Yu-Hsi Yang; Teng-Yuan Chien, all of Taiwan, Taiwan

[73] Assignee: Quarton, Inc., Taiwan

[21] Appl. No.: 08/929,819

[22] Filed: Sep. 15, 1997

[51] Int. Cl.[6] ...................................................... H01S 3/08
[52] U.S. Cl. .............................. 372/101; 372/43; 372/50; 372/108
[58] Field of Search ................................... 372/107, 101, 372/50, 43, 108

[56] References Cited

U.S. PATENT DOCUMENTS

| | | | |
|---|---|---|---|
| 4,498,737 | 2/1985 | Doggett | 372/107 X |
| 4,923,281 | 5/1990 | Krichever et al. | 372/107 X |
| 5,111,476 | 5/1992 | Hollenbeck et al. | 372/107 |
| 5,381,438 | 1/1995 | Guo et al. | 372/107 |
| 5,408,493 | 4/1995 | Aoki | 372/107 |
| 5,561,684 | 10/1996 | Martin | 372/107 |
| 5,838,703 | 11/1998 | Lebby et al. | 372/43 |

*Primary Examiner*—Brian Healy
*Attorney, Agent, or Firm*—Raymond Sun

[57] ABSTRACT

A method of manufacturing a laser module is provided, which includes the steps of providing a one-piece cylindrical housing having a bore, a front window and a rear opening, securing a lens piece in the bore adjacent the front window, introducing a laser diode into the bore through the rear opening, applying a force to the laser diode to insert the laser diode into the bore while simultaneously focusing the lens, and ceasing the application of force when the lens has been accurately focused. The present invention also provides a method of focusing the lens, which includes the steps of passing a laser beam from the laser diode through the lens, splitting the beam that has passed through the lens into separate first and second beams, directing the first beam at a first light receiving device, and directing the second beam at a second light receiving device, with respective dots being created at the first and second light receiving devices, and varying the distance between the lens and the laser diode until the dots received at the first and second light receiving devices have the same size.

18 Claims, 8 Drawing Sheets

LASER MODULES AND METHODS OF MANUFACTURING SAME

BACKGROUND OF THE INVENTION

1. Field of the Invention

The present invention relates to light-emitting modules, and in particular, to laser modules that are provided with a one-piece housing, and to methods for manufacturing same.

2. Description of the Prior Art

Currently-available laser modules include a laser source and a lens piece that are housed together. When manufacturing these laser modules, the lens must be focused with respect to the laser source. There are three currently-available embodiments of such laser modules.

Referring to FIGS. 1A and 1B, a first conventional laser module 20 is comprised of a lens housing 22 and a laser housing 26. The lens housing 22 houses an O-ring 23 and a lens 24 (see FIG. 1B). The laser housing 26 includes a laser source 28 permanently secured at one end thereof by glue or similar securing means. The lens housing 22 has a plurality of external threads 30 that are adapted to rotatably engage a plurality of internal threads 32 provided at the other end of the laser housing 26 opposite from the laser source 28. The laser housing 26 further includes a side opening or window 34 extending through the wall of the laser housing 26. During assembly of the laser module 20, the lens housing 22 is rotatably secured at the internal threads 32 of the laser housing 26, and the lens 24 is focused by rotating the two housings 22, 26 (about the threads 30 and 32) with respect to each other to adjust the relative distance between the lens 24 and the laser source 28.

The focusing can be accomplished by using conventional and well-known methods. For example, a laser beam is emitted from the laser source 28 through the lens 24 and directed on to a surface. The size of the dot formed on the surface is adjusted until the smallest dot size is obtained, and it is at this point that the lens 24 has been properly focused with respect to the laser source 28. This focusing method is typically done manually.

Once the lens 24 has been properly focused, glue can be introduced through the side window 34 to affix the lens housing 22 at the focused position with respect to the laser housing 26. A separator 36 is positioned between the laser source 28 and a PC board 38 to complete the assembly of the laser module 20. FIG. 1B illustrates the completed laser module 20.

FIGS. 2A and 2B illustrate a second conventional laser module 40, again having a lens housing 42 and a laser housing 44. The lens housing 42 includes a cylindrical housing 46, an O-ring or washer 48, a lens piece 50, and a connector 52. The cylindrical housing 46 receives the O-ring 48 and lens piece 50, with the connector 52 retaining the lens piece 50 securely inside the cylindrical housing 46. A front opening 53 is provided at a front end of the housing 46 to allow the laser beam to be emitted therethrough. The laser housing 44 includes a laser source 54 permanently secured at one end thereof, and a plurality of external threads 56 provided at the other end thereof that are adapted to engage a plurality of internal threads 58 provided on an inside surface of the connector 52. To assemble the laser module 40, glue is placed on the external threads 56, and the internal threads 58 of the connector 52 of lens housing 42 are rotatably secured at the external threads 56 of the laser housing 44. The lens 50 is then focused by rotating the two housings 42, 44 (about the threads 56 and 58) with respect to each other to adjust the relative distance between the lens 50 and the laser source 54. Once the lens 50 has been properly focused, the glue placed on the threads 56 is allowed to harden to affix the lens housing 42 at the focused position with respect to the laser housing 44. A separator or spacer 60 is positioned between the laser source 54 and a PC board 62 to complete the assembly of the laser module 40. The spacer 60 also functions to secure the laser source 54 at a fixed permanent position inside the laser housing 44. FIG. 2B illustrates the completed laser module 40. Thus, the difference between the laser modules 20 and 40 is that internal threads 32 are provided on the laser housing 26 for engaging external threads 30 of the lens housing 22 for laser module 20, while external threads 56 are provided on the laser housing 44 for engaging internal threads 58 of the lens housing 42 for laser module 40.

FIGS. 3A and 3B illustrate a third conventional laser module 70, again having a lens housing 72 and a cylindrical laser housing 74. The lens housing 72 includes a cylindrical housing 76, an O-ring or washer 78, a lens piece 80, and a spacer 82. The cylindrical housing 76 receives the O-ring 78 and lens piece 80, with the spacer 82 retaining the lens piece 80 securely inside the cylindrical housing 76. A front opening 83 is provided at a front end of the housing 76 to allow the laser beam to be emitted therethrough. The laser housing 74 includes a laser source 84 permanently secured at one end thereof by glue or similar means. The laser housing 74 further includes a side window 86 extending through the wall of the laser housing 74. A spring 88 is positioned inside the hollow cylindrical interior of the laser housing 74. During assembly of the laser module 70, the lens housing 72 is received inside the cylindrical laser housing 74, with the spring 88 operating to space the lens 80 apart from the laser source 84. The lens 80 is then focused by adjusting the relative distance between the lens 80 and the laser source 84, as controlled and biased by the spring 88. Once the lens 80 has been properly focused, glue can be introduced through the side window 86 to affix the lens housing 72 at the focused position with respect to the laser housing 74. Alternatively, the lens housing 72 and laser housing 74 can be welded together. FIG. 3B illustrates the completed laser module 70. Thus, the laser module 70 differs from the laser modules 20, 40 in that laser module 70 uses a spring 88 to adjust the relative distance between the lens 80 and the laser source 84, without using any threaded connections between the lens housing 72 and the laser housing 74.

Each of these conventional laser modules 20, 40, 70 provides at least two separate housings, one for the lens and one for the laser source, that must be adjusted with respect to each other to properly focus the lens. As a result, these laser modules 20, 40, 70 suffer from certain drawbacks. First, assembly of these laser modules 20, 40, 70 is usually done manually, typically by hand, so that assembly can be an expensive and labor-intensive process. In addition, manual focusing is always subject to human error. Second, the use of welding or the application of glue to affix one housing at a fixed position with respect to another housing is disadvantageous since the relative positions of the two housings can shift during welding, or as the glue settles and hardens, thereby affecting the proper focus of the lens. Third, the provision of two separate housings increases the number of components of the laser module 20, 40 or 70, thereby increasing the cost and complexity of the laser module 20, 40 or 70.

Thus, there still remains a need for an improved laser module which overcomes the drawbacks of the prior art laser modules. In particular, there remains a need for an improved laser module which provides for accurate focusing of the lens, which is less costly to manufacture, which minimizes the total number of components used in the assembly of the laser module, and which allows for mass-production of the laser module without the need for manual assembly.

SUMMARY OF THE DISCLOSURE

The objects of the present invention may be accomplished by providing a method of manufacturing a laser module, in which a first step provides a one-piece cylindrical housing having a bore, a front window and a rear opening. In a second step, a lens piece is secured in the bore adjacent the front window. In a third step, a laser diode is introduced into the bore through the rear opening. A tight fit may be provided between the laser diode and the internal wall of the bore. In a fourth step, a force is applied to the laser diode to insert the laser diode into the bore while simultaneously focusing the lens. In a fifth step, the application of force is ceased when the lens has been accurately focused.

In one embodiment of the present invention, a tight fit is provided between the lens and the internal wall of the bore. In another embodiment of the present invention, a spacer is positioned inside the bore adjacent the lens to secure the lens at a fixed position adjacent the front window, and a tight fit is then provided between the spacer and the internal wall of the bore.

In yet another embodiment of the present invention, an annular flange is provided about the front window, with the lens secured against the annular flange. The lens is introduced through the rear window.

In yet a further embodiment of the present invention, the lens is introduced through the front window. The bore is provided with a cylindrical front portion and a cylindrical rear portion which has a smaller diameter than the diameter of the cylindrical front portion, and an annular shoulder in the internal wall of the bore which transitions from the cylindrical front portion to the cylindrical rear portion, with the lens secured against the annular shoulder.

The present invention also provides a method of focusing the lens, which includes the steps of (a) passing a laser beam from the laser diode through the lens, (b) splitting the beam that has passed through the lens into separate first and second beams, (c) directing the first beam at a first light receiving device, and directing the second beam at a second light receiving device, with respective dots being created at the first and second light receiving devices, and (d) varying the distance between the lens and the laser diode until the dots received at the first and second light receiving devices have the same size.

Thus, the laser module according to the present invention provides a laser module in which no glue, weld or threaded connection is needed to affix any of the lenses, spacers, or laser diodes to the housings. The tight fit between the lens (or spacer) and the housing wall, or the laser diode and the housing wall, is sufficient to securely fix the relative positions of the lens and the laser diode inside the housing to ensure that the lens remains accurately focused. In addition, the methods according to the present invention allow for the provision of a single one-piece housing for both the lens and the laser diode, thereby reducing the total number of components used, and reducing the complexity and overall cost of the resulting laser modules. The present invention further provides a simple and effective focusing technique, which can be accomplished without the need for human adjustment, thereby allowing for mass-production of the laser modules, which will improve quality, increase consistency and reliability, and further reduce manufacturing costs.

DETAILED DESCRIPTION OF THE PREFERRED EMBODIMENTS

The following detailed description is of the best presently contemplated modes of carrying out the invention. This description is not to be taken in a limiting sense, but is made merely for the purpose of illustrating general principles of embodiments of the invention. The scope of the invention is best defined by the appended claims. In certain instances, detailed descriptions of well-known circuits and components are omitted so as to not obscure the description of the present invention with unnecessary detail.

The present invention provides laser modules and methods for manufacturing these laser modules. The present invention provides methods of manufacturing laser modules which includes methods for focusing the lens in manners in which the focusing can be done accurately with the aid of a computer, thereby obviating the need for manual focusing and lowering the overall cost of manufacturing the laser modules. The methods and resulting laser modules according to the present invention allow for the provision of laser modules having a single housing for retaining both the lens and the laser source, thereby providing a simplified assembly for the laser modules and further lowering the costs of manufacturing the laser modules. In the methods of the present invention, the lens is first provided at a fixed position inside the single housing, and the laser source is then simultaneously introduced and adjusted with respect to the lens to focus the lens.

Figure 1A:
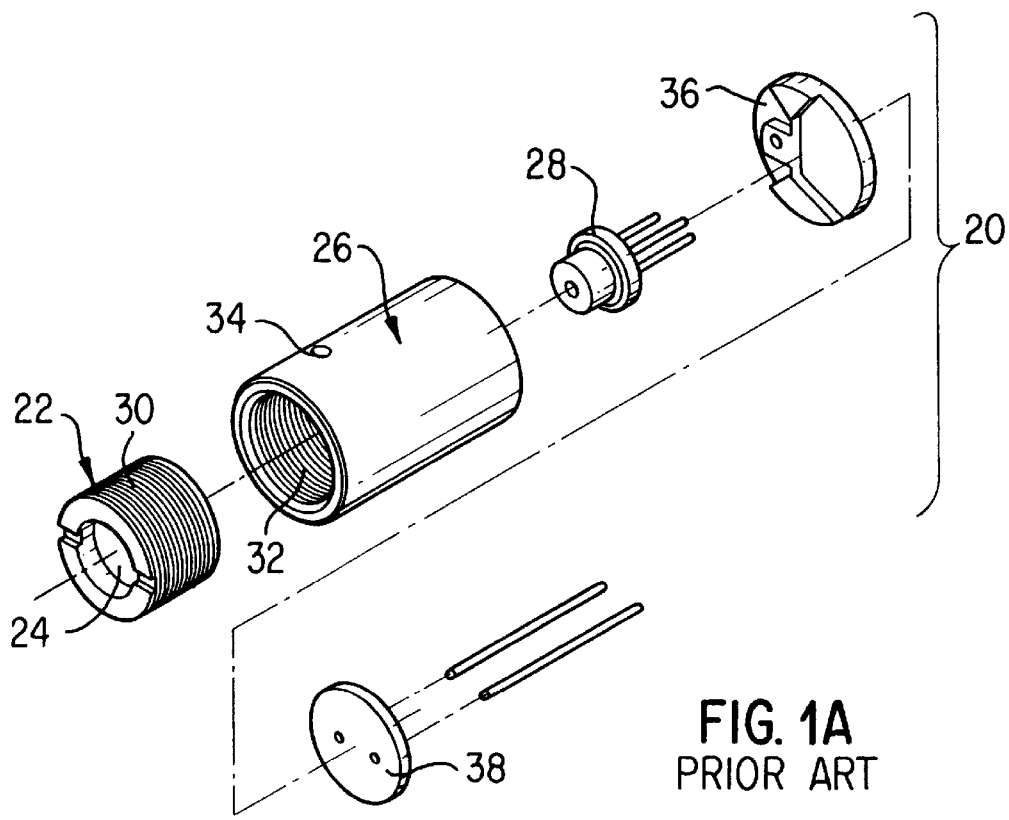
FIGS. 1A and 1B illustrate a first conventional laser module.
Figure 1B:
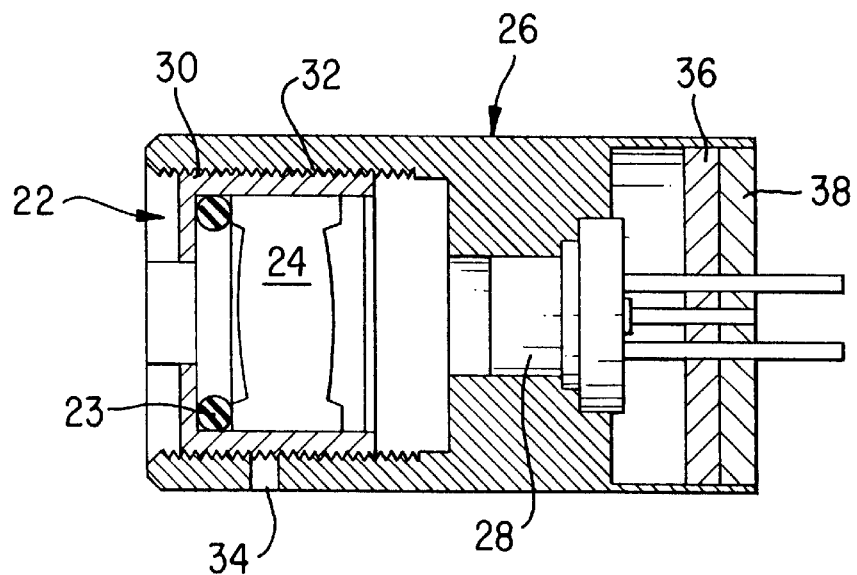
Figure 2A:
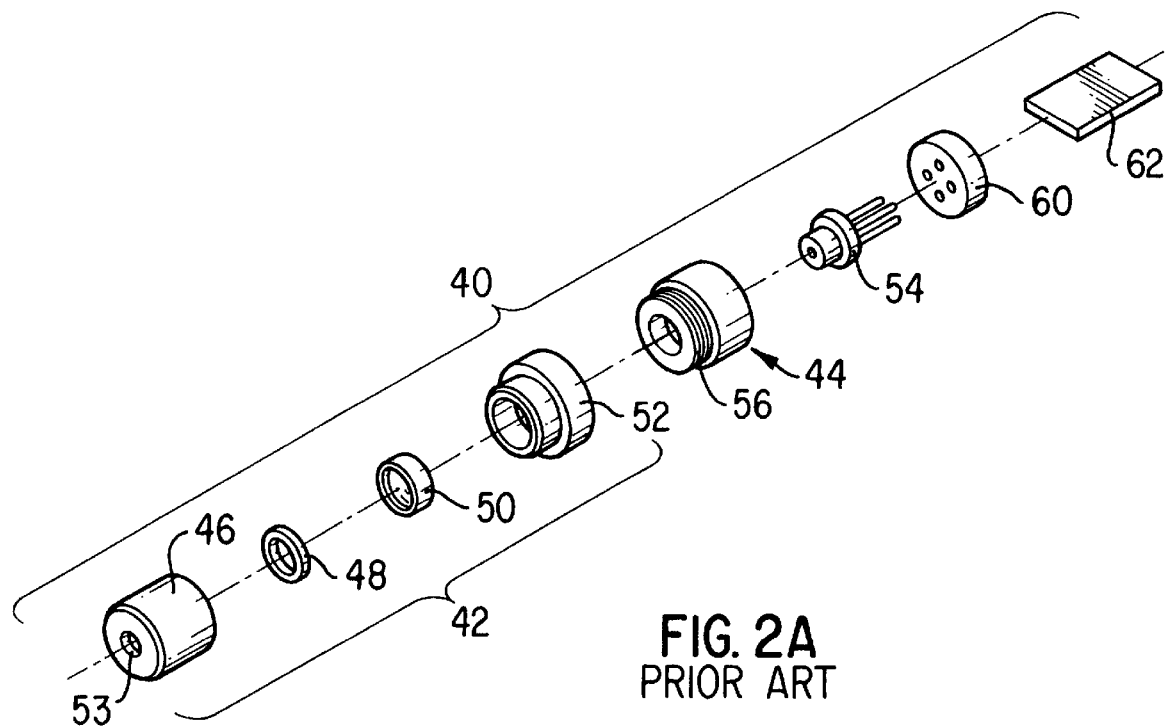
FIGS. 2A and 2B illustrate a second conventional laser module.
Figure 2B:
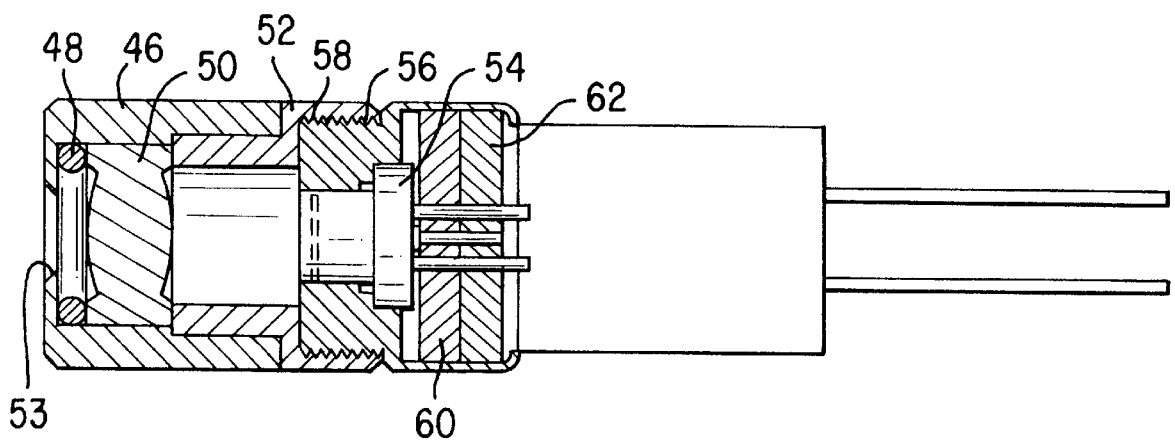
Figure 3A:
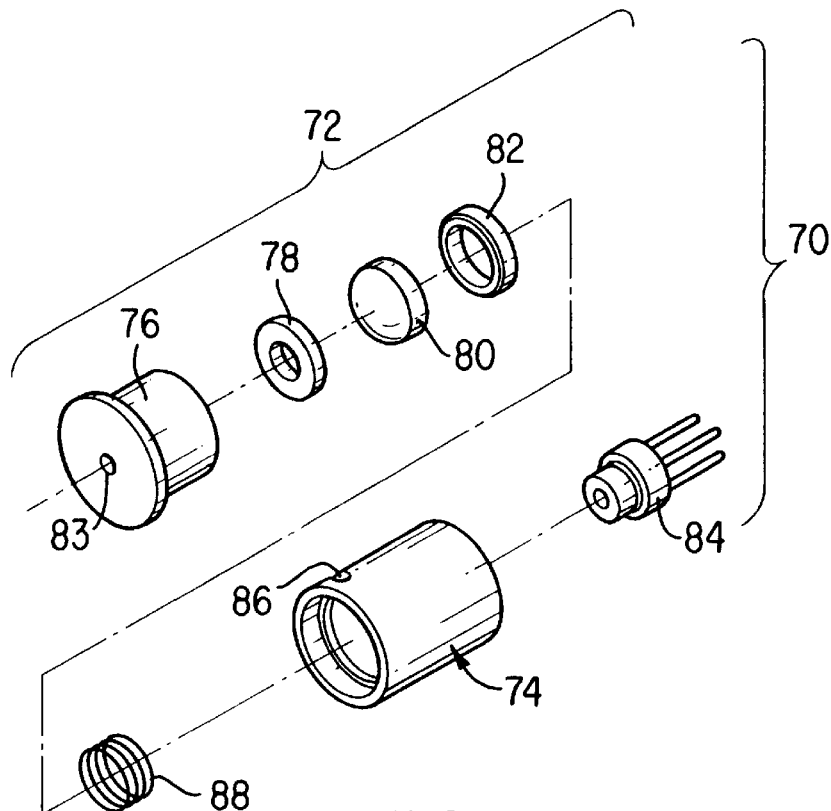
FIGS. 3A and 3B illustrate a third conventional laser module.
Figure 3B:
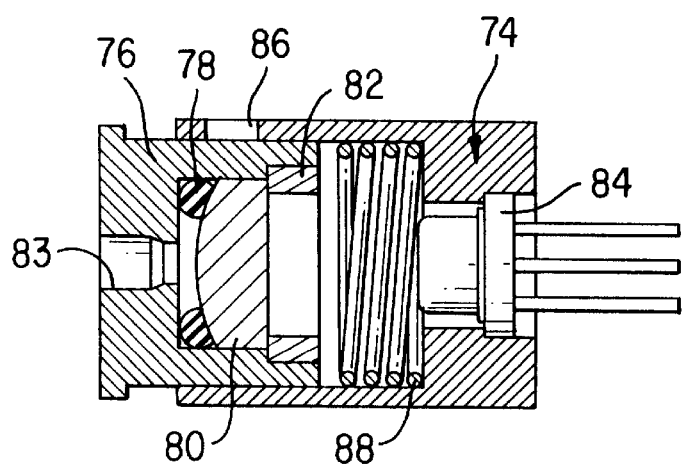
Figure 4A:
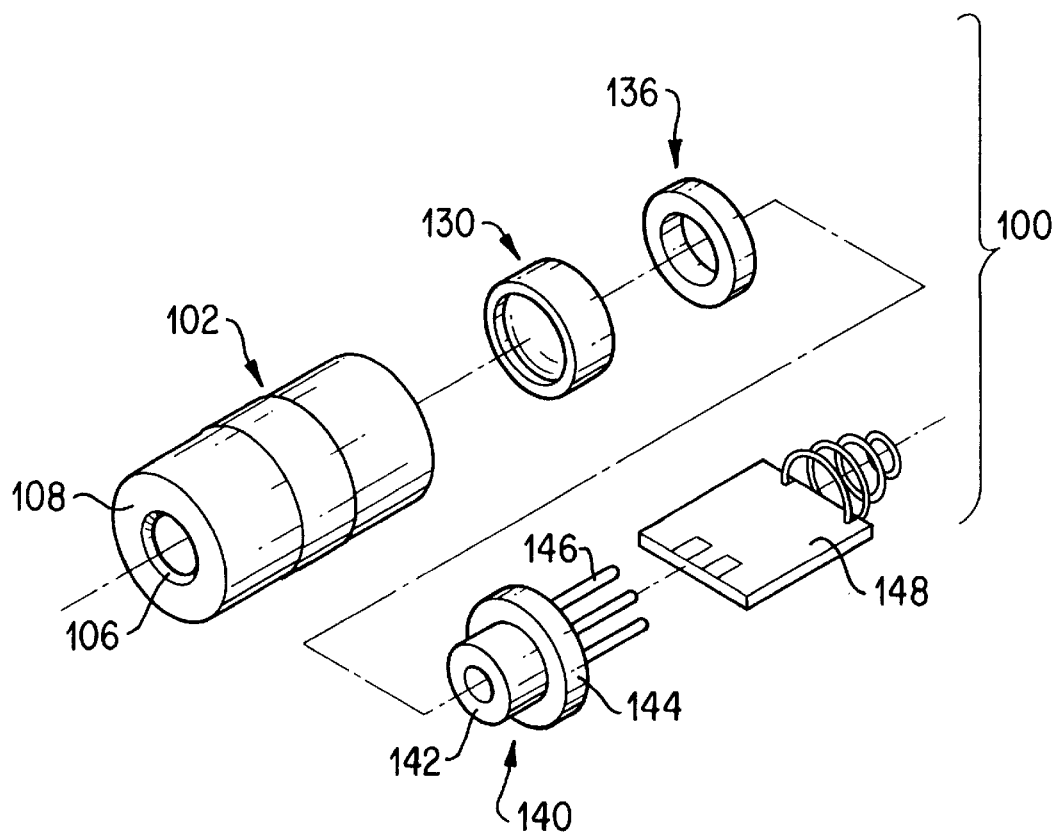
FIG. 4A is an exploded perspective view of a laser module according to a first embodiment of the present invention.
Figure 4B:
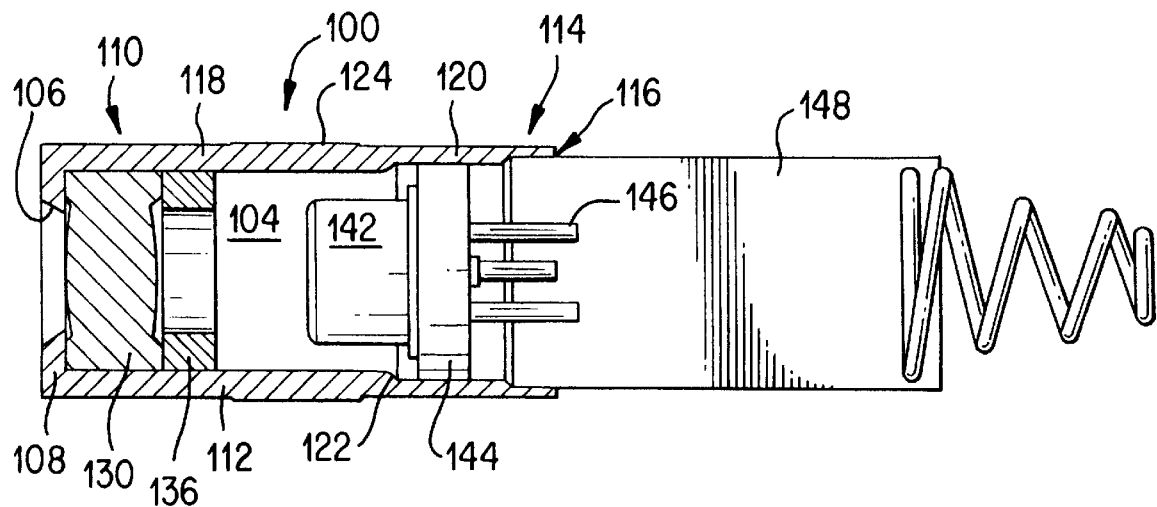
FIG. 4B is a cross-sectional side view of the laser module of FIG. 4A.

FIGS. 4A and 4B illustrate a laser module 100, and a method of manufacturing the laser module 100, according to a first embodiment of the present invention. The laser module 100 has a single housing 102, which is generally cylindrical with a hollow interior that defines an internal cavity 104. The housing 102 has a front opening or window 106 defined by an annular flange 108 extending radially inwardly from the front end 110 of the cylindrical wall 112. The rear end 114 of the housing 102 has a larger opening 116 through which the other elements of the laser module 100 are introduced. The cylindrical wall 112 has a cylindrical front portion 118 which has a greater thickness than the thickness of a cylindrical rear portion 120, so that the internal cavity 104 of the housing 102 has a greater diameter at the cylindrical rear portion 120 than at the cylindrical front portion 118, while the outer surface 124 of the cylindrical housing 102 is maintained generally smooth and cylindrical throughout. The thicker cylindrical front portion 118 transitions to the cylindrical rear portion 120 at an annular shoulder 122 inside the cavity 104.

In the first step of the method of the present invention, a lens 130 is introduced through the opening 116 at the rear end 114 of the cylindrical housing 102 and is fitted against the flange 108. The fitting of the lens 130 in the internal cavity 104 against the flange 108 need not be a tight fit, and a small spacing can be present between the lens 130 and the cylindrical wall 112 at the cylindrical front portion 118. The lens 130 can be a conventional lens piece, such as the A390CC or A375CC, both of which are manufactured and sold by Kodak.

In the second step of the method of the present invention, a spacer or washer 136 is introduced through the opening 116 at the rear end 114 of the cylindrical housing 102 and is tightly fitted against the lens 130. The spacer 136 is preferably tightly fitted against the cylindrical wall 112 at the cylindrical front portion 118 to hold the lens 130 securely in a fixed position inside the internal cavity 104 against the flange 108. The spacer 136 can be any conventional spacer, washer or O-ring.

In the third step of the method of the present invention, a laser diode 140 is introduced through the opening 116 at the rear end 114 of the cylindrical housing 102. The laser diode 140 has a light-emitting element housed in a small cylindrical housing 142 extending from a base plate 144. The laser diode 140 also includes a plurality of pins 146 that are coupled to a conventional PC board 148. The laser diode 140 can be a conventional laser diode, such as the SLD-1122 which is manufactured and sold by Sony, or the DL-3149-054 which is manufactured and sold by Sanyo.

Figure 4C:
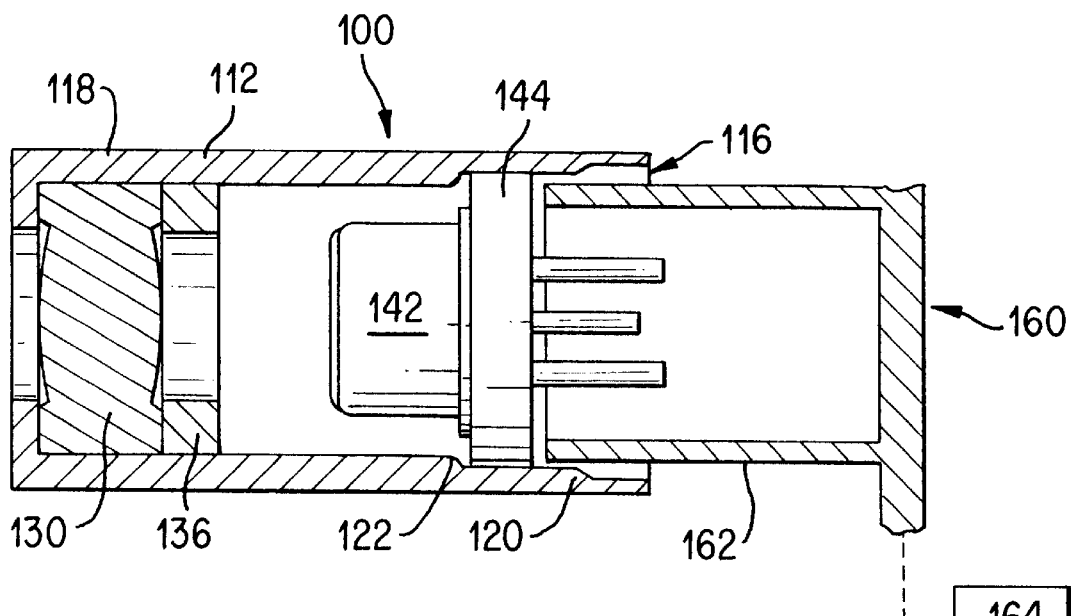
FIG. 4C is a cross-sectional side view illustrating the use of a production fixture in the assembly of the laser module of FIG. 4A.

In the fourth step of the method of the present invention, the laser diode 140 is slowly inserted into the opening 116 while the lens 130 is being focused at the same time. The base plate 144 preferably has a diameter which is about the same as, or slightly larger than, the internal diameter of the opening 116, so as to create a tight fit of the base plate 144 against the cylindrical wall 112 of the cylindrical rear portion 120. Since the base plate 144 is tightly fitted against the cylindrical wall 112 of the cylindrical rear portion 120, a production fixture 160 (see FIG. 4C, for example) is needed to carefully and slowly push the base plate 144 into the internal cavity 104 along the cylindrical rear portion 120. The production fixture 160 has a generally cylindrical body 162 that is slowly pressed against the base plate 144 of the laser diode 140 while the lens 130 is being simultaneously focused. The force imparted by the production fixture 160 is controlled by a computer or processor 164, which determines the appropriate force, as well as whether and when to stop imparting the force, based on the focusing that is occuring simultaneously with the insertion of the laser diode 140. The force applied to the base plate 144 is stopped when the processor 164 determines that the lens 130 has been accurately focused with respect to the laser diode 140. Thus, the focusing is performed by decreasing the relative distance between the lens 130 and the laser diode 140 as force is being simultaneously applied to insert the laser diode 140 into the cylindrical rear portion 120. The annular shoulder 122 defines the limits of insertion, since the annular shoulder 122 will act as a stop against the base plate 144 to prevent the laser diode 140 from being inserted into the cylindrical front portion 118.

Figure 5A:
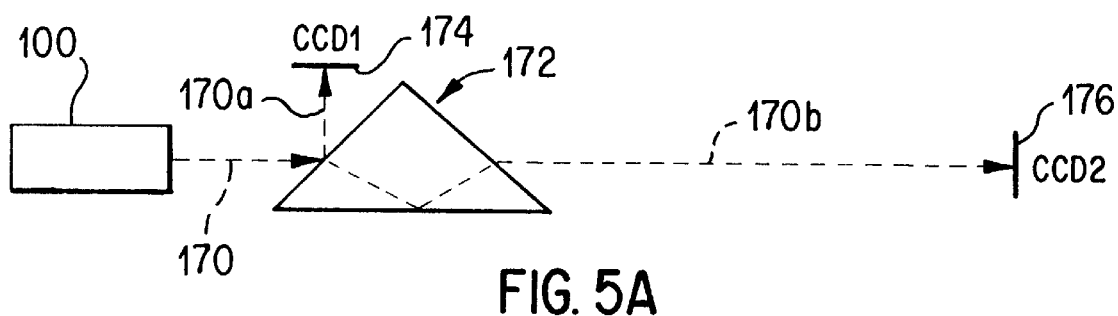
FIG. 5A illustrates one method for focusing a lens according to the present invention.
Figure 5B:
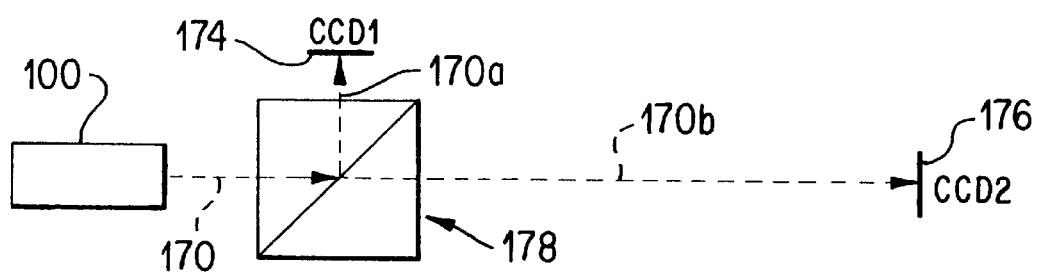
FIG. 5B illustrates another method for focusing a lens according to the present invention.

The focusing of lens 130 can be accomplished according to one of the methods illustrated in FIGS. 5A and 5B. The general principle underlying these methods is to divide a laser beam into two separate beams, each of which is directed at a separate CCD camera or other light-receiving device. The distance between the lens 130 and the laser source 140 is varied until the dot sizes of the two laser beams at the two CCD cameras are the same, at which time the lens 130 will be accurately focused.

Referring to FIG. 5A, a laser beam 170 is directed from the laser module 100 towards a prism 172 or other beam-splitting device. This laser beam 170 will have passed through the lens 130. The prism 172 splits or divides the beam 170 into two separate beams 170a, 170b. A first beam 170a is directed towards a first CCD camera 174, and a second beam 170b is directed towards a second CCD camera 176 that is located at a different location from the first CCD camera 176. The two CCD cameras 174, 176 may be positioned at the same distance, or at different distances, from the prism 172. The CCD cameras 174, 176 are coupled to the processor 164 which measures the dot sizes of the beams 170a, 170b while the relative distance between the laser diode 140 and the lens 130 is adjusted. When the dot sizes of the beams 170a, 170b are equal, the processor 164 recognizes that the lens 130 has been accurately focused, and therefore immediately disables the production fixture 160 so that no more force is imparted to the base plate 144 to cease adjustment of the relative distance between the lens 130 and the laser diode 140.

The embodiment of FIG. 5B is similar to that of FIG. 5A, except that a double prism 178 is provided instead of the single prism 172. The double prism 178 can be provided in a smaller size than the single prism 172. Again, a laser beam 170 is directed from the laser module 100 (via the lens 130) towards a double prism 178, which splits or divides the beam 170 into two separate beams 170a, 170b. A first beam 170a is directed towards a first CCD camera 174, and a second beam 170b is directed towards a second CCD camera 176 that is located at a different location from the first CCD camera 176. The two CCD cameras 174, 176 are positioned at different distances from the double prism 178. The CCD cameras 174, 176 are coupled to the processor 164 which measures the dot sizes of the beams 170a, 170b while the relative distance between the laser diode 140 and the lens 130 is adjusted. When the dot sizes of the beams 170a, 170b are equal, the processor 164 immediately disables the production fixture 160 so that no more force is imparted to the base plate 144 to cease adjustment of the relative distance between the lens 130 and the laser diode 140.

Although FIGS. 5A and 5B illustrate the use of two split beams 170a, 170b and two CCD cameras 174, 176, it is also possible to apply the principles of this method using three or more split beams and corresponding CCD cameras. In addition, although the lens 130 is focused by decreasing the relative distance between the lens 130 and the laser diode 140, the methods of FIGS. 5A and 5B can be used to focus lenses in other applications by either increasing or decreasing the relative distance between the lens and a light source.

One feature of the methods of FIGS. 5A and 5B is that the distances of the light path for beams 170a and 170b are preferably different. In the method of FIG. 5A, the two CCD cameras 174, 176 may be positioned at the same distance from the prism 172 because the first beam 170a is immediately deflected by a surface of the prism 172, while the second beam 170b travels through the prism 172. In the method of FIG. 5B, the two CCD cameras 174, 176 are preferably positioned at different distances from the double prism 178 because the distances of the light path for beams 170a and 170b through the double prism 178 are the same.

Other methods can be used to focus the lens 130. For example, the manual method described in the Background section above can also be used. According to this method, a laser beam is emitted from the laser source 140 through the lens 130 and directed on to a surface. The size of the dot formed on the surface is adjusted until the smallest dot size is obtained, and it is at this point that the lens 130 has been properly focused with respect to the laser source 140.

Once the lens 130 has been accurately focused, the assembly of the laser module 100 is complete. Since the base plate 144 is tightly held against cylindrical wall 112 inside the internal cavity 104, no glue or other affixation means is needed. The tight fit of the base plate 144 against the cylindrical wall 112 assures that the lens 130 is properly focused with respect to the position of the laser source 140, without any shifting, even during regular use of the laser module 100.

Figure 8:
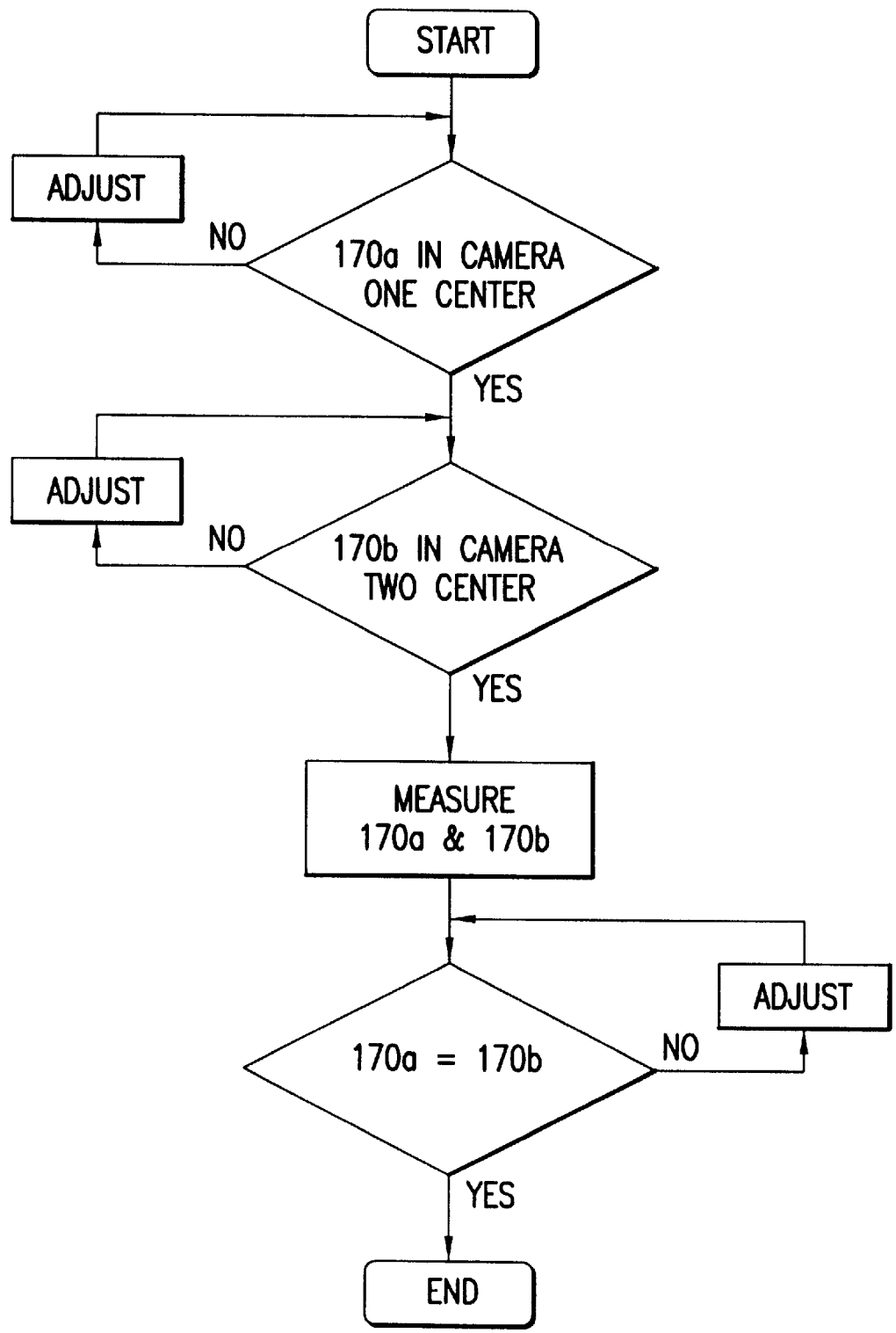
FIG. 8 is a flow-chart of a method that can be used to simultaneously determine whether the lens is accurately focused while imparting a force to insert the laser diode into the housing.

Processor 164 can contain programmed software that performs the operations involved in simultaneously determining whether the lens 130 is accurately focused, while causing the production fixture 160 to impart force to the base plate 144 to push the laser source 140 closer to the lens 130 inside the internal cavity 104. FIG. 8 is a flow-chart of one method that can be used to simultaneously determine whether the lens 130 is accurately focused, while causing the production fixture 160 to impart force to the base plate 144.

According to this method, the processor 164 determines whether the first beam 170a is centered in the first CCD camera 174. If the beam 170a is not centered in the first CCD camera 174, force is imparted to the base plate 144 to push the laser source 140 closer to the lens 130 inside the internal cavity 104 for further adjustment, until the beam 170a is centered in the first CCD camera 174. At this time, the processor 164 determines whether the second beam 170b is centered in the second CCD camera 176. If the beam 170b is not centered in the second CCD camera 176, force is imparted to the base plate 144 to push the laser source 140 closer to the lens 130 inside the internal cavity 104 for further adjustment, until the beam 170b is centered in the second CCD camera 176. The processor 164 then determines whether the dot sizes of the beams 170a, 170b are equal. If the dot sizes are not the same, force is imparted to the base plate 144 to push the laser source 140 closer to the lens 130 inside the internal cavity 104 for further adjustment, until the the dot sizes are equal, at which time the lens 130 has been accurately focused. The processor 164 then disables the production fixture 160 so that no more force is imparted to the base plate 144.

Figure 6A:
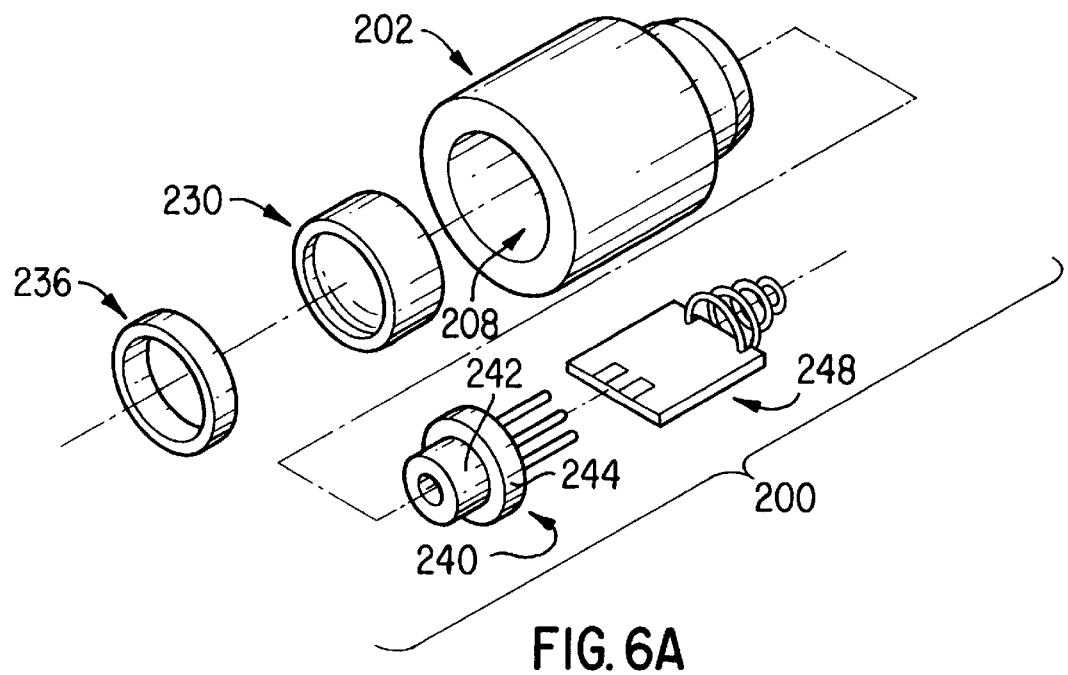
FIG. 6A is an exploded perspective view of a laser module according to a second embodiment of the present invention.
Figure 6B:
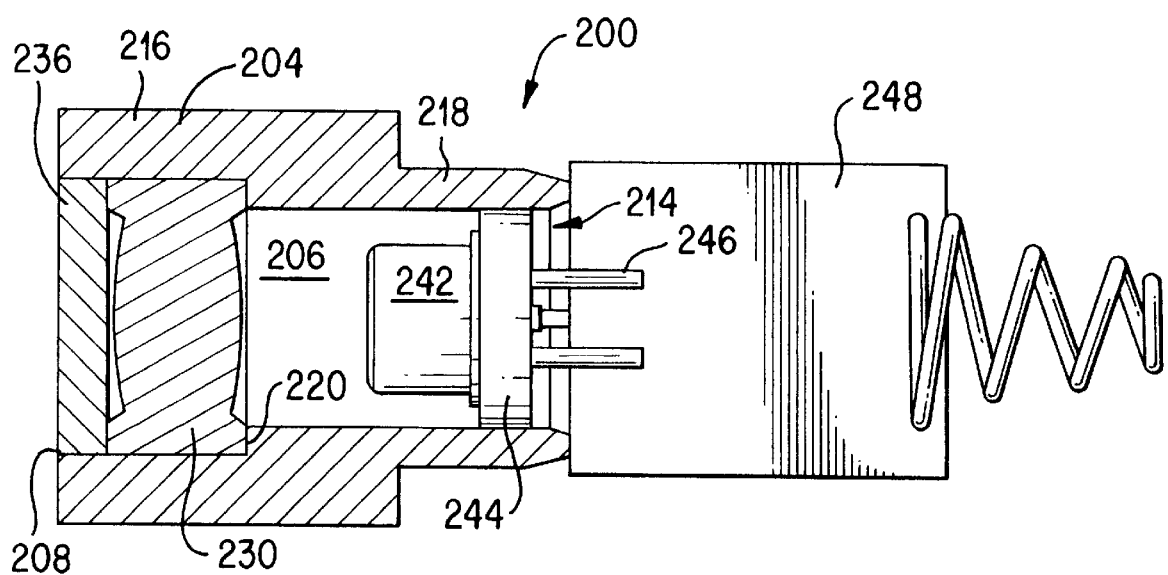
FIG. 6B is a cross-sectional side view of the laser module of FIG. 6A.

FIGS. 6A and 6B illustrate a laser module 200, and a method of manufacturing the laser module 200, according to a second embodiment of the present invention. The laser module 200 has a single housing 202, which has a generally cylindrical wall 204 with a hollow interior that defines an internal bore or cavity 206. The housing 202 has a front opening or window 208 that opens into an enlarged portion of the bore 206. The opposite end of the housing 202 has a smaller opening 214 through which the laser diode 240 is introduced. The cylindrical wall 204 has a cylindrical front portion 216 which has a larger internal diameter than the internal diameter of a cylindrical rear portion 218, so that the bore 206 of the housing 202 has a greater diameter at the cylindrical front portion 216 than at the cylindrical rear portion 218. The larger internal diameter cylindrical front portion 216 transitions to the smaller internal diameter cylindrical rear portion 218 at an annular shoulder 220.

In the first step of the method of the present invention, a lens 230 is introduced through the front window 208 of the cylindrical housing 202 and is fitted against the annular shoulder 220. The fitting of the lens 230 inside the bore 206 adjacent the annular shoulder 220 need not be a tight fit, and a small spacing can be present between the lens 230 and the cylindrical wall 204 at the cylindrical front portion 216. The annular shoulder 220 prevents the lens 230 from being pushed into the bore 206 of the cylindrical rear portion 218. The lens 230 can be a conventional lens piece, such as any of those lens pieces described above.

In the second step of the method of the present invention, a spacer or washer 236 is introduced through the front window 208 of the cylindrical housing 202 and is tightly fitted against the lens 230. The spacer 236 is preferably tightly fitted against the cylindrical wall 204 at the cylindrical front portion 216 to hold the lens 230 securely in a fixed position inside the bore 206. The spacer 236 can be any conventional spacer, washer or O-ring.

In the third step of the method of the present invention, a laser diode 240 is introduced through the rear opening 214. The laser diode 240 has a light-emitting element housed in a small cylindrical housing 242 extending from a base plate 244. The laser diode 240 also includes a plurality of pins 246 that are coupled to a conventional PC board 248. The laser diode 240 can be a conventional laser diode, such as any of those laser diodes described above.

The fourth step of the method of the present invention is very similar to the fourth step of the method for manufacturing laser module 100. As with the laser module 100, with lens 230 positioned at a fixed position within the housing 202, the laser diode 240 is then introduced while the lens 230 is being simultaneously focused. The base plate 244 again preferably has a diameter which is about the same as, or slightly larger than, the internal diameter of the opening 214, so as to create a tight fit between the base plate 244 against the cylindrical wall 204 of the cylindrical rear portion 218. The production fixture 160 can again be used to slowly press the base plate 244 of the laser diode 240 while the lens 230 is being simultaneously focused. The force imparted by the production fixture 160 is controlled by the processor 164, using the method of FIG. 8, which determines the appropriate force, as well as whether and when to stop imparting the force, based on the focusing that is occuring simultaneously with the insertion of the laser diode 240. The force applied to the base plate 244 is stopped when the processor 264 determines that the lens 230 has been accurately focused with respect to the laser diode 240. Thus, the focusing is performed by decreasing the relative distance between the lens 230 and the laser diode 240 as force is being simultaneously applied to insert the laser diode 240 into the cylindrical rear portion 220. The focusing of lens 230 can be accomplished by using any of the methods described above, including the methods of FIGS. 5A and 5B.

Once the lens 230 has been accurately focused, the assembly of the laser module 200 is complete. Since the base plate 244 is tightly held against cylindrical wall 204 inside the bore 206, no glue or other affixation means is needed. The tight fit of the base plate 244 against the cylindrical wall 204 assures that the lens 230 is properly focused with respect to the position of the laser source 240, without any shifting, even during regular use of the laser module 200.

In addition, for the laser module 200 described above, it is possible to omit the spacer 236 if the fitting or frame of the lens 230 is provided with a diameter which is about the same as, or slightly larger than, the internal diameter of the front window 208, so as to create a tight fit between the lens 230 against the cylindrical wall 204 of the cylindrical front portion 216.

Figure 7A:
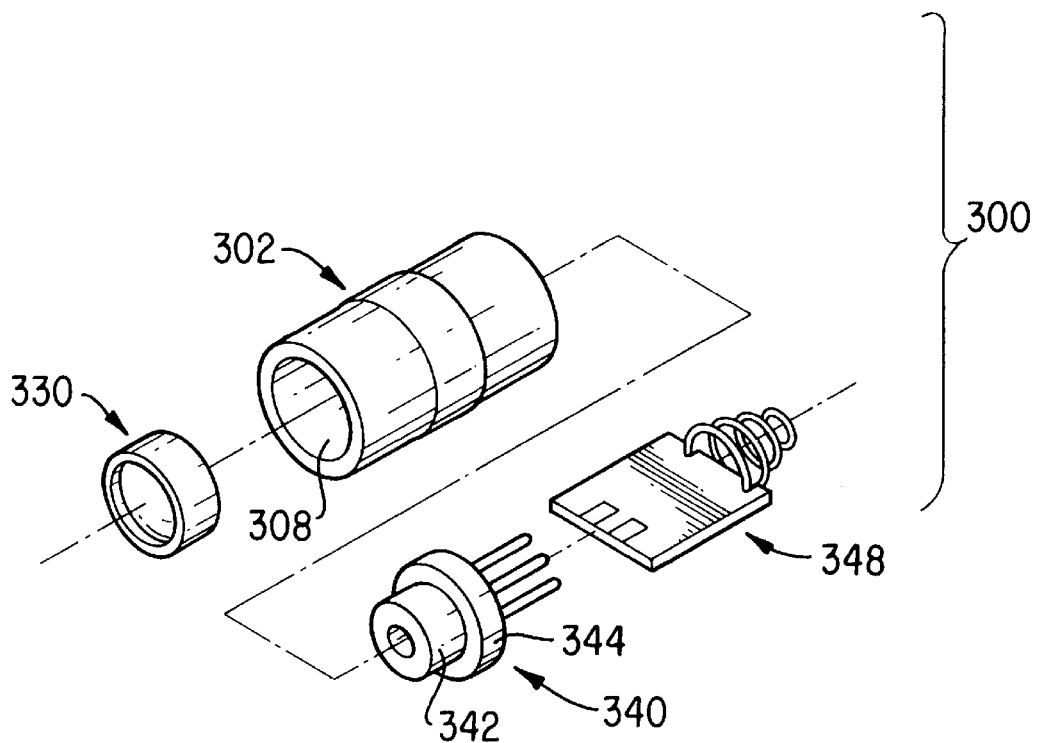
FIG. 7A is an exploded perspective view of a laser module according to a third embodiment of the present invention.
Figure 7B:
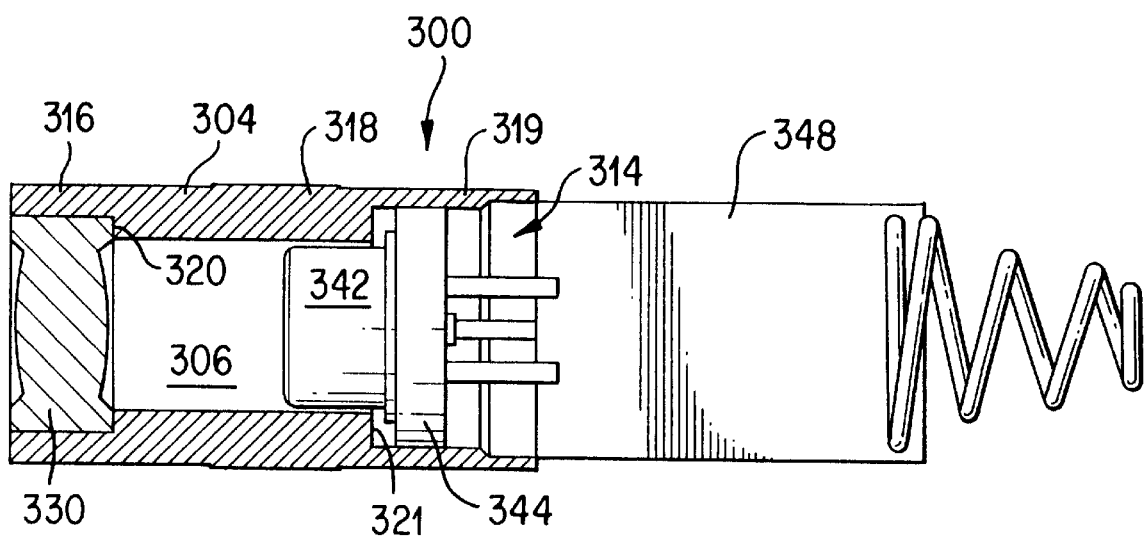
FIG. 7B is a cross-sectional side view of the laser module of FIG. 7A.

FIGS. 7A and 7B illustrate a laser module 300 according to a fourth embodiment of the present invention. The laser module 300 is very similar to laser module 200, except that the lens 330 in laser module 300 is provided to be tightly fitted with the cylindrical wall 304, so that a spacer is no longer needed, and is therefore not provided. The cylindrical housing 302 is also similar to cylindrical housing 202, in that its cylindrical wall 304 defines an internal bore or cavity 306. A front window 308 opens into an enlarged portion of the bore 306, and the opposite end of the housing 302 has a smaller opening 314 through which the laser diode 340 is introduced. The cylindrical front portion 316 has a larger internal diameter than the internal diameter of the cylindrical rear portion 318, with the larger internal diameter cylindrical front portion 316 transitioning to the smaller internal diameter cylindrical rear portion 318 at an annular shoulder 320.

Another difference between the laser modules 200 and 300 is that the lens 230 is larger than the laser diode 240, while the lens 330 is about the same size as the laser diode 340. As a result, the cylindrical rear portion 318 has a rear section 319 that has a thickness which is smaller than the thickness of the rest of the cylindrical rear portion 318, and transitioning at another annular shoulder 321. This allows the base plate 344 of the laser diode 340 to be tightly fitted against the cylindrical wall 304 at the rear section 319, and to abut against the annular shoulder 321 which acts as a stop against further advancement of the base plate 344 inside the bore 304.

The method of assembly for laser module 300 is the same as that for laser module 200, except that no spacer is provided and the lens 330 preferably has a diameter which is about the same as, or slightly larger than, the internal diameter of the front window 308, so as to create a tight fit between the lens 330 against the cylindrical wall 304 of the cylindrical front portion 316. Thus, either laser module 200 or 300 can be provided, depending upon the desired sizes of the lens and/or laser diode.

One benefit of the laser modules 100, 200, 300 according to the present invention is that no glue, weld or threaded connection is needed to affix any of the lenses, spacers, or laser diodes to the housings. The tight fit between the lens (or spacer) and the housing wall, or the laser diode and the housing wall, is sufficient to securely fix the relative positions of the lens and the laser diode inside the housing to ensure that the lens remains accurately focused. Although not specifically mentioned above, the tight fits can be accomplished, for example, by a friction fit.

In addition, the methods according to the present invention allow for the provision of a single housing for both the lens and the laser diode, thereby reducing the total number of components used, and reducing the complexity and overall cost of the resulting laser modules. In this regard, the single cylindrical housings 102, 202 and 302 are preferably provided in one piece. The present invention further provides a simple and effective focusing technique, which can be accomplished without the need for human adjustment, thereby allowing for mass-production of the laser modules, which will improve quality, increase consistency and reliability, and further reduce manufacturing costs.

While the description above refers to particular embodiments of the present invention, it will be understood that many modifications may be made without departing from the spirit thereof. The accompanying claims are intended to cover such modifications as would fall within the true scope and spirit of the present invention.

What is claimed is:

1. A method of manufacturing a laser module, comprising the steps of:
   a. providing a one-piece cylindrical housing having a bore, a front window and a rear opening, the bore having an internal wall;
   b. securing a lens piece in the bore adjacent the front window;
   c. introducing a laser diode into the bore through the rear opening;
   d. applying a force to the laser diode to insert the laser diode into the bore while simultaneously focusing the lens.

2. The method of claim 1, further including the step of:
   e. ceasing the application of force when the lens has been accurately focused.

3. The method of claim 1, wherein step (c) further includes the step of:
   c1. providing a tight fit between the laser diode and the internal wall of the bore.

4. The method of claim 1, wherein step (b) further includes the step of:
   providing a tight fit between the lens and the internal wall of the bore.

5. The method of claim 1, further step (b) further includes the steps of:
   positioning a spacer inside the bore adjacent the lens to secure the lens at a fixed position adjacent the front window; and
   providing a tight fit between the spacer and the internal wall of the bore.

6. The method of claim 1, wherein step (a) further includes the step of:
   providing an annular flange about the front window, with the lens secured against the annular flange.

7. The method of claim 6, wherein step (b) further includes the step of:
   introducing the lens through the rear window.

8. The method of claim 1, wherein step (b) further includes the step of:
   introducing the lens through the front window.

9. The method of claim 8, wherein step (a) further includes the step of:
   providing the bore with a cylindrical front portion and a cylindrical rear portion which has a smaller diameter than the diameter of the cylindrical front portion, and an annular shoulder in the internal wall of the bore which transitions from the cylindrical front portion to the cylindrical rear portion, with the lens secured against the annular shoulder.

10. The method of claim 1, further comprising a method of focusing the lens which includes the following steps:
   i. passing a laser beam from the laser diode through the lens;

ii. splitting the beam that has passed through the lens into separate first and second beams;

iii. directing the first beam at a first light receiving device, and directing the second beam at a second light receiving device, with respective dots being created at the first and second light receiving devices; and iv. varying the distance between the lens and the laser diode until the dots received at the first and second light receiving devices have the same size.

11. A laser module, comprising:

a one-piece cylindrical housing having a bore, a front window and a rear opening, the bore having a internal wall;

a lens provided separate from the housing and secured by friction fit inside the bore adjacent the front window without the use of any threaded, weld or glue connection; and a laser diode provided separate from the housing and secured by friction fit inside the bore adjacent the rear window without the use of any threaded, weld or glue connection.

12. The laser module of claim 11, wherein the laser diode is secured adjacent the rear opening by a tight fit between the laser diode and the internal wall of the bore.

13. The laser module of claim 11, further including a spacer positioned inside the bore adjacent the lens to secure the lens at a fixed position adjacent the front window, wherein the spacer is secured to the internal wall of the bore by a tight fit between the spacer and the internal wall of the bore.

14. The laser module of claim 11, wherein the housing includes an annular flange about the front window, with the lens secured against the annular flange.

15. The laser module of claim 11, wherein the bore includes a cylindrical front portion and a cylindrical rear portion which has a smaller diameter than the diameter of the cylindrical front portion, and an annular shoulder in the internal wall of the bore which transitions from the cylindrical front portion to the cylindrical rear portion, with the lens secured against the annular shoulder.

16. A method of focusing a lens during the assembly of a laser module, the laser module including a lens and a laser diode, comprising the following steps:

a. passing a laser beam from the laser diode through the lens;

b. splitting the beam that has passed through the lens into separate first and second beams;

c. directing the first beam at a first light receiving device, and directing the second beam at a second light receiving device, with respective dots being created at the first and second light receiving devices; and d. varying the distance between the lens and the laser diode until the dots received at the first and second light receiving devices have the same size.

17. The method of claim 16, wherein step (b) further includes the step of:

b1. providing a beam splitter at the path of the laser beam that has passed through the lens.

18. The method of claim 16, wherein step (d) further includes the steps of:

d1. centering the dot at the first light receiving device;

d2. centering the dot at the second light receiving device; and d3. determining whether the dots received at the first and second light receiving devices have the same size.

* * * * *